United States Patent [19]

Ferriss

[11] 4,414,535
[45] Nov. 8, 1983

[54] MAGNETIC RESONANCE GYRO SIGNAL PROCESSOR

[75] Inventor: Lincoln S. Ferriss, Lincoln Park, N.J.

[73] Assignee: The Singer Company, Little Falls, N.J.

[21] Appl. No.: 144,145

[22] Filed: Apr. 28, 1980

Related U.S. Application Data

[63] Continuation-in-part of Ser. No. 931,702, Aug. 7, 1978, abandoned.

[51] Int. Cl.³ .............................. H03K 13/02
[52] U.S. Cl. ..................... 340/347 AD; 340/347 M; 340/347 SY; 324/304; 324/300; 328/30
[58] Field of Search .... 340/347 M, 347 SV, 347 AD; 328/30; 324/0.5 R, 324; 250/231 GY

[56] References Cited

U.S. PATENT DOCUMENTS 3,778,700 12/1973 Bayley et al. ............... 324/304
3,808,542 4/1974 Ferriss ........................... 328/30
3,873,908 3/1975 Young ........................ 324/304 X
3,914,760 10/1975 Logue ..................... 340/347 AD
4,209,746 6/1980 Abramov et al. ............ 324/304 X

OTHER PUBLICATIONS

Gellender, Learn Microprocessor Fundamentals, Electronic Design 21, 11 Oct. 1977, pp. 74–79.
Roberts, Picture Coding Using Pseudo-Random Noise, 2/1962 IRE Transactions on Information Theory, (IT-8, No. 2, pp. 145–154).
Federal Scientific Corp., Dithering Increases Dynamic Range and . . . , FSC-L-569/100; 24 Aug. 1973, pp. 1–8.
Steele, Delta Modulation Systems, 1975, Halsted Press (division of J. Wiley & Sons, Inc., pp. 296–299).
Schuchman, Dither Signals and Their Effect on Quantization Noise, 12/1964, IEEE Trans. on Commun. Technol., vol. Com-12, pp. 94–97.
Jayant et al., The Application of Dither to the Quantization of Speech Signals, BSTJ, vol. 51, No. 6, Jul.–Aug. 1972, pp. 1293–1297.

Primary Examiner—Thomas J. Sloyan
Attorney, Agent, or Firm—T. W. Kennedy; L. A. Wright

[57] ABSTRACT

A signal processor which involves separation of the cell signals from a magnetic resonance gyro (MRG) using phase locked loops that also serve as frequency multipliers, phase shifting one cell output to maintain phase comparisons within the monotonic region of the phase detectors, PDM/Digital conversion of the MRG signals and finally microcomputer processing to obtain gyro angle to the required resolution and update rate.

1 Claim, 10 Drawing Figures

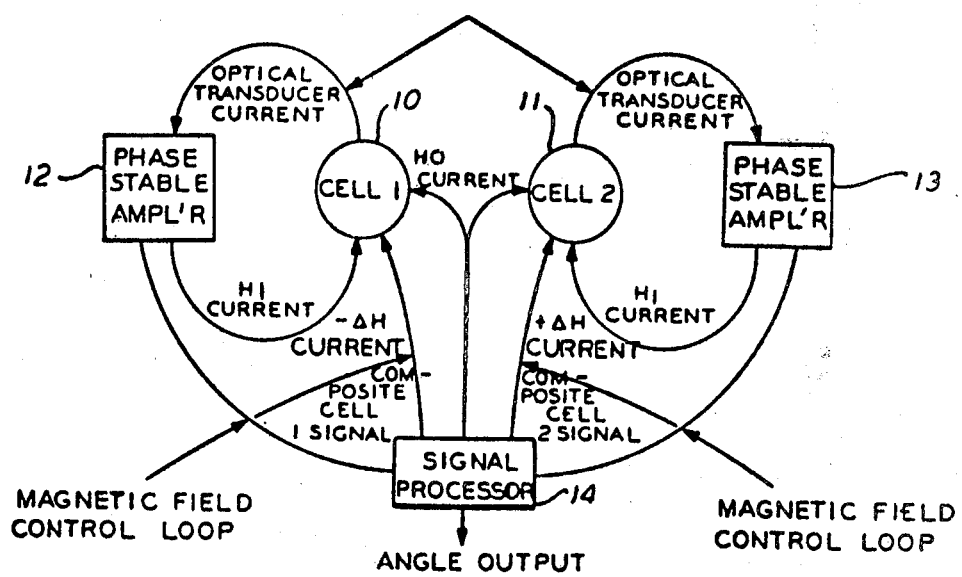
FIG. 1
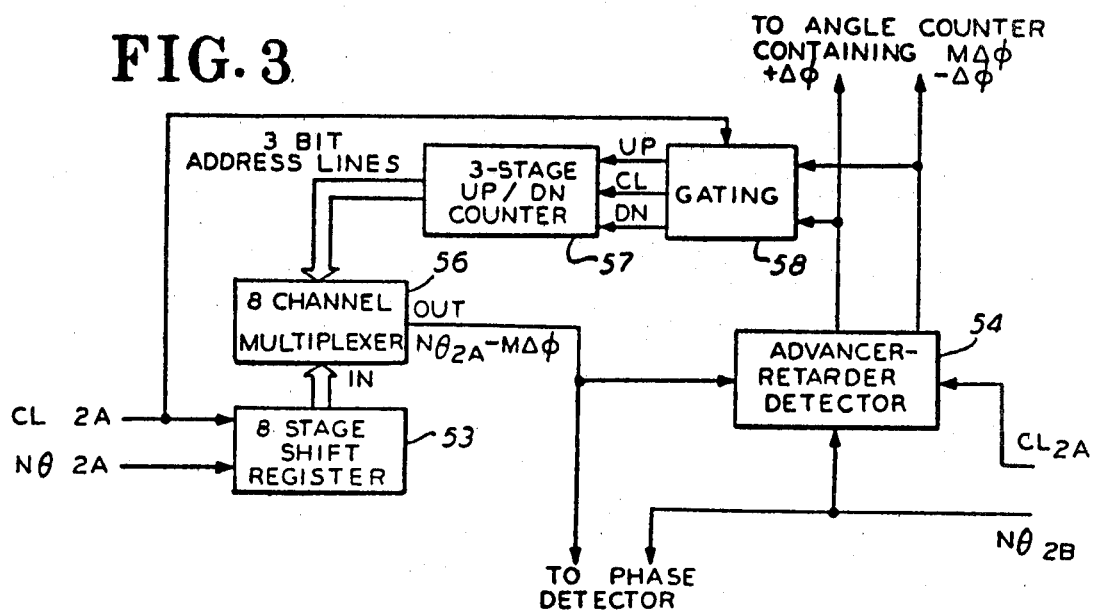
FIG. 3
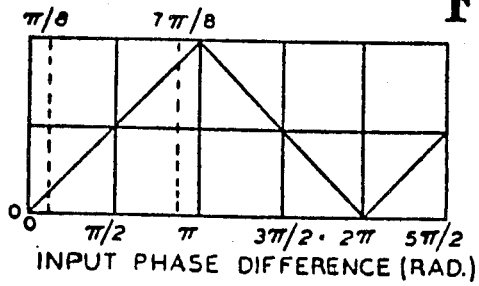
FIG. 5
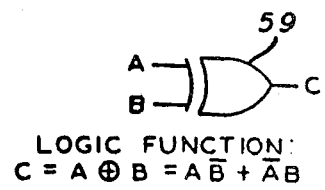
LOGIC FUNCTION:
$C = A \oplus B = A\bar{B} + \bar{A}B$

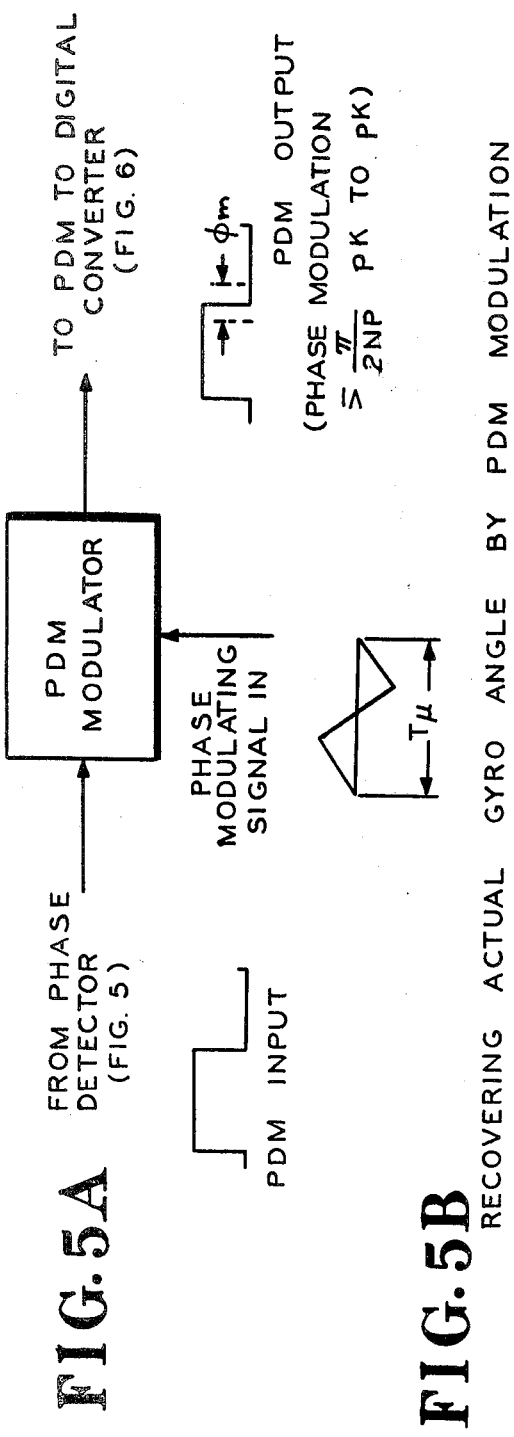
FIG.5A
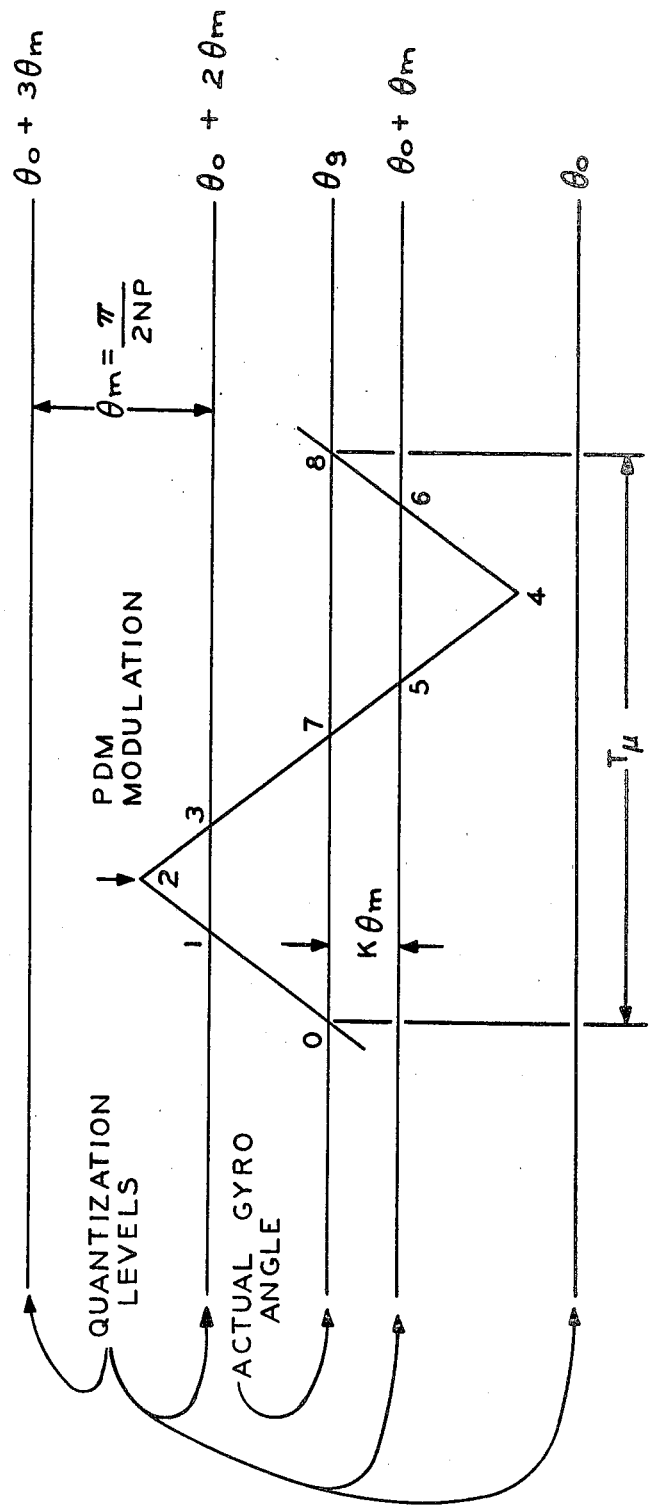
FIG.5B RECOVERING ACTUAL GYRO ANGLE BY PDM MODULATION

MAGNETIC RESONANCE GYRO SIGNAL PROCESSOR

CROSS-REFERENCE TO RELATED APPLICATIONS

This is a continuation-in-part of application Ser. No. 931,702, filed Aug. 7, 1978 abandoned.

PRIOR ART

U.S. Pat. No. 3,778,700: Bayley et al, December, 1973
U.S. Pat. No. 3,808,542: Ferriss, April, 1974
"Picture Coding Using Pseudo-Random Noise" by Lawrence Gilman Roberts, appearing in the February, 1962 IRE Transactions on Information Theory (IT-8, No. 2, pp. 145-154, February, 1962).
"Delta Modulation Systems" by R. Steele, pp. 296-299, published in 1975 by Halsted Press, a Division of John Wiley & Sons, Inc., N.Y.
"Dither Signals and Their Effect on Quantization Noise" by Leonard Schuchman, appearing in IEEE Trans. Commun. Technol., vol. COM-12, pp. 162-165, December 1964.
"The Application of Dither to the Quantization of Speech Signals" by N. S. Jayant and L. R. Rabiner, published in American Telephone and Telegraph Company, The Bell System Technical Journal, Vol. 51, No. 6, July-August, 1972.

This invention is related to the magnetic resonance gyro. More particularly, this invention is a signal processor for converting the gyro output angle to digital form.

BACKGROUND OF THE INVENTION

The atomic nuclei of certain materials possess magnetic moments which arise out of their inherent angular moments or spin properties. These special properties of certain materials form the principle upon which the nuclear gyro operates.

U.S. Pat. No. 3,778,700, assigned to the same assignee as the present invention, discloses an optically pumped nuclear magnetic resonance gyroscope device in the preferred embodiment of which two different isotopes of mercury are utilized in the cells of two interconnected spin generators. As taught therein, each sping generator comprises a mercury absorption cell containing $^{199}Hg$ and $^{201}Hg$ which is subjected to a DC magnetic field, $H_o$ and to an AC magnetic field, $H_1$ perpendicular to field $H_o$. The magnetic fields $H_o$ of the two cells are described as being equal and antiparallel to each other. The mercury absorption cells are optically pumped by a circularly polarized beam of light to increase the magnitude of the net magnetic moment and phase comparison means are provided to derive a readout signal representative of gyro angular rotation about a given axis by comparing the phase outputs of the two spin generators.

The disadvantages of the prior art early schemes were:
1. Gyro output was in analog forms not readily useable by modern-day navigation computers without conversion.
2. Mechanization required bulky and expensive electro-mechanical devices which are slow in response time.
3. Stability of the phase shift introduced by the resolver scheme is dependent not only on the resolver characteristics, but also on the stability of the resistor and capacitor (the phase shifter works ideally only at a single frequency).
4. Filters prior to the resolver introduce phase instability with time degrading output.

Thus, there is a need to implement a system which will provide digital signals which will satisfy the fast midcourse corrections of present day missiles and other gyro controlled devices.

BRIEF SUMMARY OF THE INVENTION

Briefly, the apparatus of the present invention comprises a magnetic resonance gyro having a digital phase shifter which converts the gyro's inherent analog signals into digital pulse count and a residual PDM signal which is further converted to a digital word. The set of digitized signals are applied to a microprocessor system where the digital gyro output angle is constructed for use by the navigation or guidance computer.

Accordingly, it is an object of this invention to provide a means for converting the analog signals from a magnetic resonance gyro to digital signals for direct measurement of gyro angle by modern-day navigation and guidance computers.

This and other objects, features and advantages of the present invention will become more apparent from the following description taken in conjunction with the accompanying drawings wherein:

FIG. 1 is a simplified block diagram of a conventional magnetic resonance gyro;

FIG. 3 is a more detailed block diagram of the phase shifter of FIG. 2;

FIG. 5 shows the selected monotonic range of the transfer characteristics of the phase detector of FIG. 2;

FIG. 5A shows a block diagram of the PDM modulator;

FIG. 5B is a graph showing how the actual gyro angle is recovered when it falls between PDM modulation levels;

Referring to FIG. 1, there is shown a simplified block diagram of a magnetic resonance gyro that outputs an analog signal which is subsequently digitized according to the invention. The spin generator cells 10 and 11 comprise absorption cells containing $^{199}Hg$ and $^{201}Hg$ which is subjected to a DC field $H_o$. In the spin generator loops, the phase stable amplifiers 12 and 13 receive input signals from photodiodes (not shown) associated with each cell and also supply energy to the nuclei of the mercury isotopes to sustain steady-state Larmor oscillations. The composite cell signals are supplied to the signal processor 14 which provides angular output information.

Figure 2:
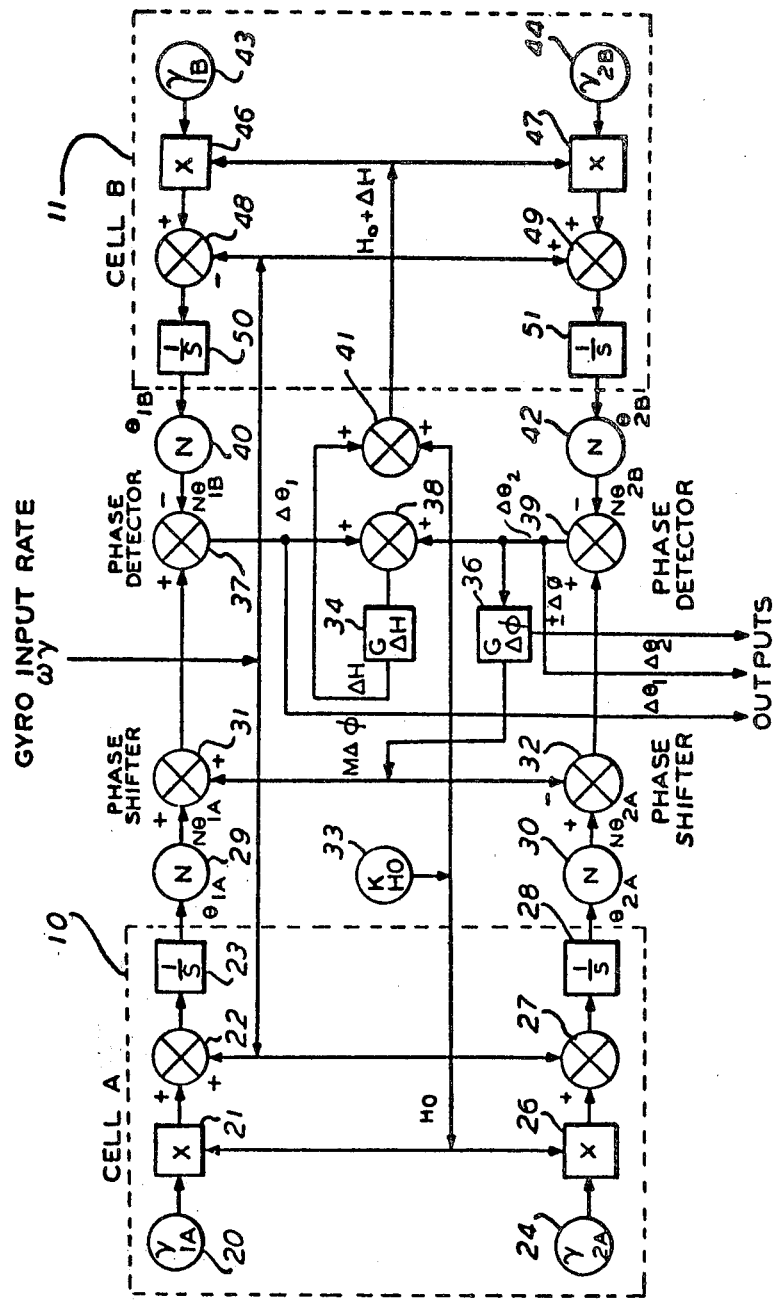
FIG. 2 is a block diagram in servo-oriented format of the mechanization of the gyro elaborated upon by this invention.

A more detailed diagram in the classical control system format of a magnetic resonance gyro mechanization is shown in FIG. 2. Cells 10 and 11 are shown in dotted outline. The four phase locked loop (PLL) frequency/phase multipliers 29, 30, 40 and 42 scale output phases by a factor N, prior to phase comparison in phase shifters 31 and 32. Because phase detectors 37 and 39 are monotonic over a range of only $\pi$ radians some kind of phase shifter is required to prevent sense changes. The need for a phase shifter can be recognized by assuming a fixed input rate considering the angles which would accummulate at the inputs to the phase detector over time. The phase shifter is introduced by $G\Delta\phi$ block 36 which feeds back a phase identified as $M\Delta\phi$ tending to restrict the magnitude of the output of the phase detector. In earlier mechanizations, this was implemented using a pair of resolvers for the phase shifters with shafts connected together. The $G\Delta\phi$ block 36 was a servo amplifier driving a motor to which the resolvers' shafts were connected. Thus the output $\Delta\theta_2$ of phase detector 39 is driven to null by the null-seeking servo containing the $G\Delta\phi$ block 36. Under that mechanization, the integrated rate, $\omega n/S = \theta_r$, is given by:

$$\theta_r = -M\Delta\phi/2N \quad (1)$$

Thus, the gyro output is proportional to the resolver shaft angle and may be outputted in this manner. Requirements for strapped-down gyros for use in navigation systems in the 1 n.m. per hour class call for an angular resolution of 1 sec. To operate a resolver/synchro output to digitize to that resolution it would require a 20 bit converter to achieve 1.24 sec. resolution:

$$\frac{360 \times 60 \times 60}{2^{20}} \cong 1.24 \left( \frac{\text{sec}}{\text{bit}} \right) \quad (2)$$

This resolution requirement surpasses the performance capabilities of fast rate tracking converters.

The essentials of the digital phase shifter of the present invention can be explained by using FIG. 2. Here the output of phase detector 39 is allowed to accumulate an output angle $\Delta\theta_2$ by placing a dead-band in block 36 ($G\Delta\phi$). When $\Delta\theta_2$ exceeds the dead-band a quantum of phase shift $\Delta\phi$ is introduced into phase shifters 31 and 32 within the period of the phase detection, thus shifting $\Delta\theta_2$ by an amount $-\Delta\phi$. The number of $\Delta\phi$'s introduced is accumulated in a counter (see reference symbol 82 in FIG. 8) which totalizes $\Delta\phi$ pulses thus containing $\pm M\Delta\phi$. The total output of the gyro is contained by the quantized value $M\Delta\phi$ and the residual $\Delta\phi_2$. Moreover, block 34 ($G\Delta H$) is operated as a null-seeking servo forcing $\Delta\phi_1 = \Delta\phi_2$. The quantities labelled OUTPUT are:

$$\Delta\phi_1 = 2N\theta_r + M\Delta\phi \quad (3a)$$

$$\Delta\phi_2 = -2N\theta_r - M\Delta\phi \text{ and } \Delta\phi \quad (3b)$$

In the PDM to digital converter (FIG. 6) digital conversions of $\Delta\theta_1$ and $\Delta\theta_2$ are performed at a binary submultiple level of $\Delta\phi$. The remaining operations include subtraction of (3b) from (3a), subtraction of $M\Delta\phi$ from the result and division by 4N by bit location recognition, thus producing $\theta_r$, all performed by the microcomputer of FIG. 8.

Having briefly described the overall signal processing scheme, each of the elements will now be considered in more detail.

Figure 4:
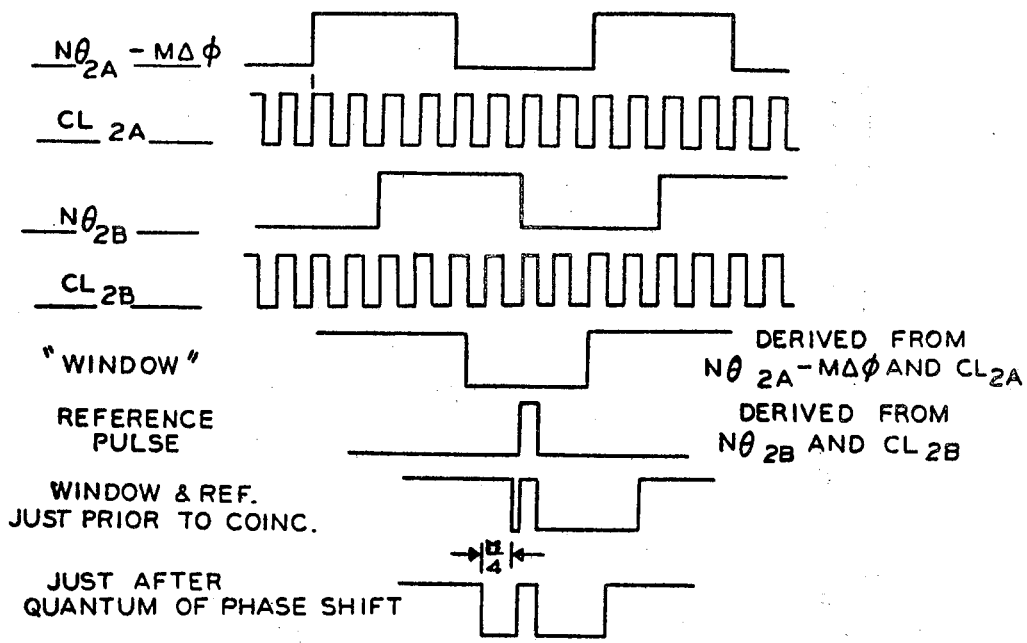
FIG. 4 shows the signal inputs to the phase shifter of FIG. 3.

Turning to FIG. 3, a block diagram of the digital phase shifter 31 is shown. Block diagram 32 is identical to block 31 and the description which follows applies equally to both. The two input signals, $N\theta_{2A}$ and $N\theta_{2B}$ to the phase shifters 31 and 32 are square waves from the phase-locked-loop frequency multipliers which have raised the cell output signals to a frequency N times the original. Input signal $N\theta_{2A}$ is applied along with clock pulse CL2A to eight stage shift register 53 and input pulse signal $N\theta_{2B}$ along with clock pulse CL2B is applied to advancer retarder detector 54. The clock pulse inputs are square waves at a frequency eight times the input signals. These signals are generated within the phase-locked-loop frequency multipliers and are frequency and phase-locked with their respective input signals as shown in FIG. 4. The output from the eight stage register 53 is applied to eight channel multiplexer 56. Also applied to block 56 are three bit address lines from three stage up/down counter 57. The advancer retarder detector provides an output signal $+\Delta\phi$ and $-\Delta\phi$ which are applied to gating circuit 58 and to the angle counter (not shown). Gating circuit 58 has a third input, clock pulse CL2A and outputs to up/down counter 57. The output of the eight channel multiplexer 56 is a signal $N\theta_{2A} - M\Delta\phi$ which is applied as an output signal to the phase detector 59 and to the advancer retarder detector 54.

The fundamental purpose of the digital phase shifter is to maintain the signals $N\theta_{2A} - M\Delta\phi$ and $N\theta_{2B}$ which go to the phase detector within a selected monotonic range of the transfer characteristic as shown in FIG. 5 for an Exclusive OR gate 59. The output can be in terms of either the logic "1" level output duty cycle or the average value of the output voltage. The point to be made is that the transfer characteristic is periodic having positive and negative slopes. The region to which operation is confined by the action of this digital phase shifter is between $\pi/8$ and $7\pi/8$, shown by the dotted lines. Within the advancer-retarder detector 54 an electronic "window" is effectively generated. Relative phases $N\theta_{2A} - M\Delta\phi$ and $N\theta_{2B}$ which fall within this window produce no activation of the phase shifter. As the relative phase equals or exceeds the window limits an output pulse is generated on one of the lines $+\Delta\phi$ or $-\Delta\phi$. After synchronization to the CL2A within gating circuit 58, three stage ring counter 57 is incremented or decremented. The counter contents represented by the states of three flip-flops determine a binary number 0 through 7 which represents closure of one of eight input switches of multiplexer 56. The incrementing or decrementing of the ring counter 57 causes the switch previously closed to open and an adjacent switch to close which connects the correspondingly numbered state of shift register 53 to the output line of multiplexer 56. Within shift register 53 at any time are eight images of the input $N\theta_{2A}$ each shifted in phase by $\pi/4$ ($\frac{1}{8}$ of $2\pi$) by the action of the clock CL2A operating at eight times the input frequency. The selection of an adjacent stage of shift register 53 thus is tantamount to shifting the output phase by a quantized increment of $\pi/4$ radians. The appearance of $N\theta_{2A} - M\Delta\phi$ on the output line, with M now having been incremented or decremented by one, effects the phase shift of $\pi/4$ causing the phase comparison, previously residing at either $\pi/8$ or $7\pi/8$ on the phase transfer characteristic to shift toward the center of the characteristic, to either $3\pi/8$ or $5\pi/8$ dependent on phase advancement or retardation. The $\pm\Delta\phi$ pulse generated is accumulated in the angle counter of FIG. 8 as a measure of total digital phase shift, $\pm M\Delta\phi$.

The completion of the phase shifting sequence is achieved within three clock pulses allowing a maximum phase shifting rate of one quantum per period of input. That is, dm/dt is equal to the frequency of the input:

$$dm/dt = Nf_c \quad (4)$$

where $f_c$ is the frequency of Larmor oscillation associated with $\gamma_2$.

Differentiating equation (1) with respect to time and substituting equation (4):

$$\omega r = -\frac{\Delta\phi f_c}{2} \quad (5)$$

For $\Delta\phi = \pi/4$, $f_c = 1000$, $\omega_r = 12.5\pi$ or greater than 6 revolutions per second. This is the only electronics-imposed rate limitation apparent at this time.

Figure 6:
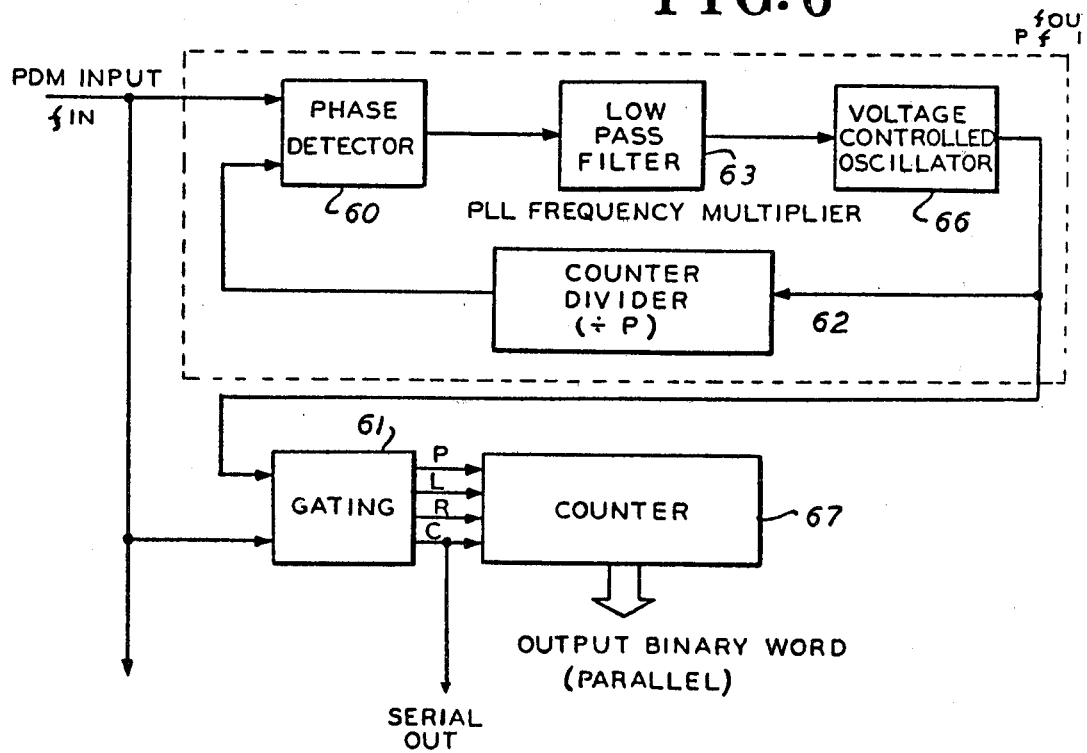
FIG. 6 shows the pulse duration modulation to digital converter.

Turning to FIG. 6, there is shown a schematic block diagram of the PDM to digital converter. A PDM input from the phase modulator of FIG. 5A is applied to phase detector 60 and gating circuit 61. Phase detector 60 also receives a signal from counter divider 62. The output of phase detector 60 is applied to low pass filter circuit 63 and the output of circuit 63 is applied to voltage control oscillator 66 which converts the dc input into pulse output. The blocks enclosed in the dotted outline are a conventional PLL (phase-locked loop) frequency multiplier. The pulse signals from the voltage control oscillator 66 is applied to the counter divider 62 and gating circuit 61. Gating circuit 61 provides four output signals for application to counter 67. Gating circuit 61 provides serial output signals on line c and counter 67 provides parallel binary word output. The output frequency is P times the input frequency $f_{in}$. Or another way of thinking of it, within each period of the input are generated P output pulses. Usually a binary ripple counter is used as the frequency divider such that P is some integral power of 2. U.S. Pat. No. 3,808,542 teaches a PDM to digital converter which may be employed in the invention.

The total gyro angle $\theta_r$ is contained in the pulse count M multiplied by the phase shift weighting of $\Delta\phi$ plus the residual angle represented by the index of modulation of the pulse duration modulation outputs of the phase detectors.

When 50% duty-cycle square waves are applied to the exclusive OR gate 59 (FIG. 5) used as a phase detector, the output signal is a PDM wave at a frequency twice that of the input frequency. The range from $-100\%$ modulation (duty cycle=0) to $+100\%$ modulation (duty cycle=maximum) corresponds to a range of the phase detector transfer characteristic of $\pi$ (r). From equation (3) that equivalent gyro angle is:

$$\pi = 2N\theta_p$$

The equivalent gyro angle stored in the PDM wave is:

$$\theta_p = \pi/2N \text{ (rad)} \quad (6)$$

By operating the multiplied input frequency and the PDM input signal into AND gate 61 an output pulse train is generated wherein for each period of the input PDM wave the number of output pulses, expressed as a fraction of P is numerically equal to the duty cycle of the input PDM waveform. By use of gating circuit 61 the counter 67, with preset capability and built-in latches, can output in the following manner:

1. During that portion of the PDM input where the input is high or at the logic 1 value the binary output word is that from the previous PDM period.

2. At the point in time where the PDM input goes low the binary output changes to a value representative of the current PDM period.

Figure 7:
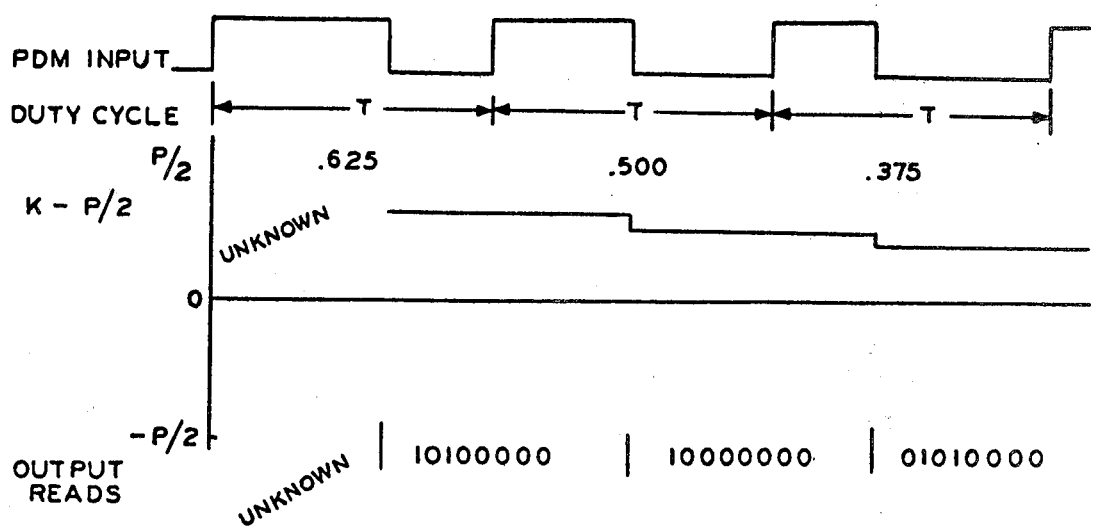
FIG. 7 shows the three full periods of the pulse duration modulation input waveforms and the corresponding digital output.

This is illustrated in FIG. 7 where three full periods of a PDM input wave are shown with the duty cycle varying linearly from ⅝ to ⅞. Assume for example $P = 2^8 = 256$. Since the value of the PDM wave preceding the first shown, the output value is unknown except that it would lie between 00000000 and 11111111. At the negative going transition of the first PDM wave $K = 0.625 \times 256 = 160$ pulses would have incremented the counter to read 10100000 and the output would be latched at that time, after unlatching the counter is zeroed to await the positive going input of the next PDM wave. Meanwhile, the latches cause the output to remain displayed until updating at the next negative going transition.

Now, fixing more numbers to this example, assume $N=8$ for the multipliers associated with $\gamma_2$ frequency of 1 KHZ. By equation (6) the PDM wave, at 16 KHZ, contains 11.25° of the equivalent input angle. With $P=2^8$ the least significant bit of the contents of the counter in the PDM to Digital Converter (or the angular value of the serial pulse) is $11.25° \div 2^8 = 0.044$. The frequency of operation of the VCO in the converter is $16 \text{ KHZ} \times 2^8 = 4.096$ MHz.

Other options are available using this general scheme. The counter could be present to $-P/2$ instead of being zeroed thus removing the offset angle. Also, multiple period summations could be generated by zeroing or presetting and latching after a selected number of PDM periods have taken place. If the number A is chosen as the number of periods over which summation takes place, equations for the quantization level and the time between updates can be developed and are:

$$\theta_q = \frac{324 \times 10^3}{NPA} \text{ (sec)} \quad (7)$$

$$T_\mu = \frac{A}{sNf_c(\gamma)} \text{ (sec)} \quad (8)$$

Turning to FIG. 5A PDM modulator 100 receives PDM signals from phase detector 59 shown in FIG. 5. Where the technique for improving angular resolution by multiple period summations is used a means of linearly phase modulating the output of phase modulator 100 is required. The phase modulating signal may be obtained from the microprocessor of FIG. 8. Modulating the PDM signal with a linear modulating signal having a peak-to-peak amplitude at least as large as the PDM quantization level assures that gyro angles residing between PDM quantization levels are made apparent to the PDM to digital converter and subsequently to the successive summation. Those skilled in the art of integer quantization averaging techniques will recognize that the improved estimate of gyro angle, increased in resolution by a factor A, is biased to a lower value by an amount equal to one half the quantization level of the PDM to digital converter. However, the bias angle is easily added during the summation process.

Equation (6) is the gyro angle stored in the PDM wave as modulation:

$$\theta_p = \pi/2N \text{ (rad)} \tag{6}$$

The PDM to digital converter demodulates the PDM wave resolving the gyro angle further by the factor P, the multiplication factor of the phase locked loop (PLL) in the PDM to digital converter. Thus the quantization level associated with the output of the PDM to digital converter is:

$$\theta_m = \frac{\theta_p}{P} = \frac{\pi}{2NP} \text{ (rad)} \tag{6a}$$

FIG. 5B is a pictorial representation of a case where the actual gyro angle $\theta_g$ lies between two adjacent quantization levels, shown as horizontal lines 101 and 102, separated by $\theta_m$. The gyro angle shown has a value $$\theta_g = \theta_o + \theta_m + k\theta_m \tag{6b}$$

In the absence of any systematic linear PDM modulation the PDM converter would output the angle representative of the quantization level just smaller than the true gyro angle. The maximum error approaches $\theta_m$ as k approaches 1.

Additional resolution can be obtained by modulating the PDM waveform with a linear periodic wave and successively summing PDM conversion samples over a period of the modulation. One period of triangular PDM modulation (period $T_{82}$) is shown. The modulation has a peak value $\theta_m$ and an absolute slope $4\theta_m/T_\mu$.

The presence of the modulation causes PDM conversion to quantize at three levels. The average value of the converted angle is $$\theta_{avg.} = \theta_o + \frac{\theta_m}{2} + k\theta_m \tag{6c}$$

Comparison with equation (6b) shows this value is less than the actual gyro angle by one half the quantization level. Those skilled in integer quantization averaging recognize that this bias angle of $\theta_m/2$ is normal and expected for this type of signal processing. If A successive sums are accumulated over a period $T_\mu$ resolution is again improved by the factor A.

Referring again to FIG. 5A, the quantization times at low, intermediate and high levels are calculated as follows:

$$t_{0-1} = \frac{(1-k)\pi}{2NP} \cdot \frac{NPT_\mu}{2\pi} = \frac{(1-k)T_\mu}{4}$$

$$t_{1-2} = \frac{k\pi}{2NP} \cdot \frac{NPT_\mu}{2\pi} = \frac{kT_\mu}{4}$$

$$t_{2-3} = t_{4-5} = t_{7-8} = t_{1-2}$$

$$t_{3-4} = t_{5-6} = t_{6-7} = t_{0-1}$$

Quantization time at highest level =

$$2 \cdot t_{1-2} = \frac{kT_\mu}{2}$$

Quantization time at intermediate level =

$$2 \cdot (t_{0-1}) + 2(t_{1-2}) = \frac{T_\mu}{2}$$

-continued

Quantization time at low level =

$$2(t_{o-1}) = \frac{(1-k)T_\mu}{2}$$

High quantization level = $\theta_0 + 2\theta_m$ where $\theta_m = \frac{\pi}{2NP}$ Intermediate level = $\theta_0 + \theta_m$ Low level = $\theta_0$ Average converted angle over 1 Modulation period $\theta_a$ $$\theta_a = \frac{[\theta_0 + 2\theta_m] \cdot \frac{kT_\mu}{2} + [\theta_0 + \theta_m]\frac{T_\mu}{2} + \theta_0 \cdot \frac{(1-k)T_\mu}{2}}{T_\mu}$$

$$= \frac{k}{2}\theta_0 + k\theta_m + \frac{\theta_0}{2} + \frac{\theta_m}{2} + \frac{\theta_0}{2} - \frac{k\theta_0}{2}$$

$$= \theta_0 + k\theta_m + \frac{\theta_m}{2}$$

Since the actual gyro angle is $\theta_g = \theta_0 + k\theta_m + \theta_m/2$, the average computed angle is quantized ½ a quantization level less $(\theta_m/2)$.

The frequency of oscillation of the VCO in the converter is the limiting frequency and can be expressed by:

$$f(VCO) = 2NPF_{c(\gamma)} \tag{9}$$

Assuming a center frequency of 16.384 MHZ as a conservation choice equation (9) produces a value $NP = 8.192 \times 10^3$. Imposing a 1.24 sec resolution requirement from equation (2) and solving for A in equation (7) a value of 32 is obtained. Finally from equation (8) a time between updates of 2 ms. is obtained. The combination of 1.24 sec resolution, 2 ms. update rate and the rate handling capability of 2250 degrees per second satisfies not only the most stringent requirements for strapped down navigation systems, but also for all but the high spin rate stabilized tactical guidance applications.

Figure 8:
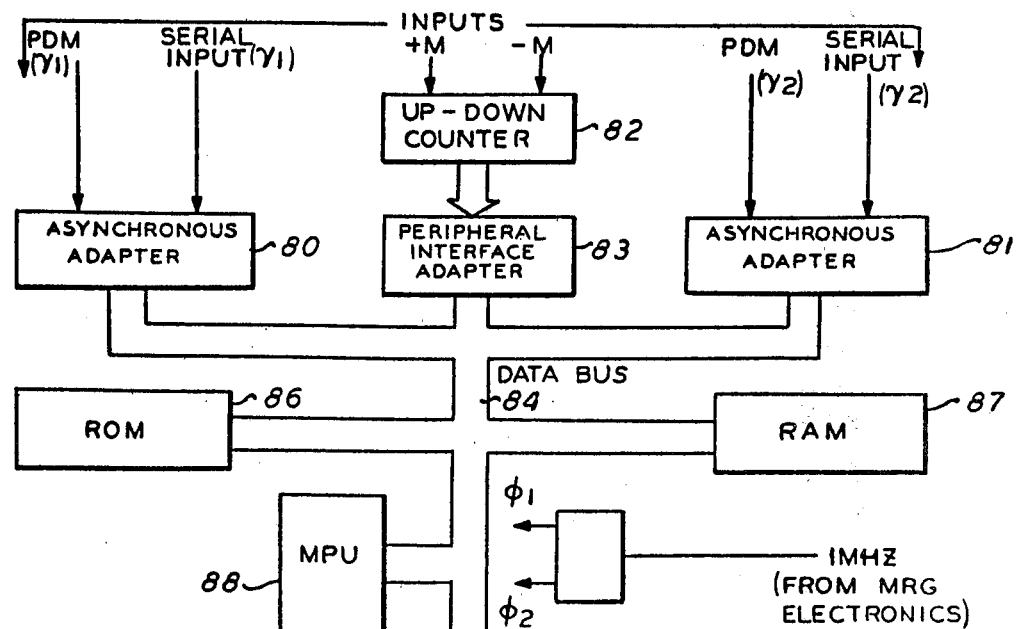
FIG. 8 shows the microprocessor with the outputs of the PDM/Digital converter and with the $\Delta\phi$ pulses inputted to an Up/Down counter.

Referring to FIG. 8, the processing of the digital signals is accomplished by use of the microprocessor shown. The outputs of the two PDM/Digital converters are inputted to a pair of asynchronous interface adapters 80, 81 while the $\Delta\phi$ pulses are counted by an up/down counter 82 and paralleled into a peripheral interface adapter 83. Interconnecting the microprocessor unit with I/O interface and interface I.C.'s (integrated circuits) and memory I.C.'s (integrated circuits) is the parallel data bus 84. The read only memory 86 (ROM) contains the program which operates on equation (3) to yield gyro input angle $\theta_r$ with the appropriate summation. The random access memory 87 (RAM) stores interim computations, performed by the microprocessor 88, or in an expanded processing version of this microcomputer, stores moving average computations, based on a triangular averaging technique. At the output of the microprocessor through a pair of peripheral adapters 89 and 90 is the 20 bit binary word (1.24 sec LSB) representing total MRG gyro input angle $\theta_r$, updated at the required rate.

While particular embodiments of the invention have been shown and described, modifications may be made, and it is intended in the following claims to cover the embodiments which fall within the true spirit and scope of the invention.

What is claimed is:

1. A signal processor operating on inherently analog signals for converting them to digital words representing gyro angle comprising:

a source of composite analog signals containing gyro angular displacement, means for separating and frequency-multiplying said gyro analog signals retaining phase coherence, phase detector means for detecting and comparing said frequency multiplied signals and for producing a residual PDM signal, means for incrementally phase shifting said frequency multiplied signals and accumulating the number of said increments such that subsequent phase comparisons remain within a fixed monotonic region of said phase detection means, means for operating on said residual PDM signal producing a digital word representative of the duty cycle, and means for scaling and adding said accumulated number of said increments produced by said phase shifting means to the result of said digital word thereby producing digital output words representing gyro angle, wherein said means for incrementally phase shifting said signals comprises:

a shift register containing eight images of said gyro analog signals, a multiplexer connected to said shift register for maintaining the phase shifted signal within a selected monotonic range, an advancer-retarder detector connected to said multiplexer for developing an electronic window for retarding the analog signals which fall within said electronic window, a gating circuit to maintain phase detection inputs within a monotonic range, and an up/down counter connected to said gating circuit and providing a three bit address to the input of said multiplexer.

* * * * *